United States Patent
Hsu et al.

(10) Patent No.: US 8,043,878 B2
(45) Date of Patent: Oct. 25, 2011

(54) METHOD FOR MANUFACTURING HIGH EFFICIENCY LIGHT-EMITTING DIODES

(75) Inventors: Ta-Cheng Hsu, Hsinchu (TW); Jung-Min Hwang, Hsinchu (TW); Min-Hsun Liu, Hsieh (TW); Ya-Lan Yang, Hsinchu (TW); De-Shan Kuo, Hsinchu (TW); Tsun-Kai Ko, Hsinchu (TW); Chien-Fu Shen, Hsinchu (TW); Ting-Chia Ko, Hsinchu (TW); Schang-Jing Hon, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 218 days.

(21) Appl. No.: 12/379,561

(22) Filed: Feb. 25, 2009

(65) Prior Publication Data

US 2009/0162960 A1 Jun. 25, 2009

Related U.S. Application Data

(63) Continuation-in-part of application No. 11/602,199, filed on Nov. 21, 2006, now Pat. No. 7,811,845.

(51) Int. Cl.
 *H01L 21/00* (2006.01)
(52) U.S. Cl. .................................. 438/33; 257/E21.228
(58) Field of Classification Search .................... 438/33, 438/463; 257/E21.228
See application file for complete search history.

(56) References Cited

U.S. PATENT DOCUMENTS

| | | | |
|---|---|---|---|
| 6,298,079 B1 | 10/2001 | Tanaka et al. | |
| 6,468,902 B2 * | 10/2002 | Kawai | 438/667 |
| 6,605,548 B1 | 8/2003 | Bardwell | |
| 6,849,524 B2 | 2/2005 | Shelton et al. | |
| 6,933,208 B2 * | 8/2005 | Yanagisawa et al. | 438/455 |
| 7,183,136 B2 * | 2/2007 | Hashimura et al. | 438/113 |
| 2005/0221515 A1 | 10/2005 | Yanashima et al. | |
| 2008/0070380 A1 * | 3/2008 | Kusunoki | 438/462 |

* cited by examiner

*Primary Examiner* — Chandra Chaudhari
(74) *Attorney, Agent, or Firm* — Bacon & Thomas, PLLC

(57) ABSTRACT

A method for manufacturing a light-emitting device comprising the steps of cutting a light-emitting unit by a laser beam, and cleaning the light-emitting unit by an acid solution to remove by-products resulted from the laser cutting.

18 Claims, 11 Drawing Sheets

METHOD FOR MANUFACTURING HIGH EFFICIENCY LIGHT-EMITTING DIODES

REFERENCE TO RELATED APPLICATION

This application is a continuation-in-part of U.S. patent application Ser. No. 11/602,199, entitled "METHOD FOR MANUFACTURING HIGH EFFICIENCY LIGHT-EMITTING DIODES", filed on Nov. 21, 2006, now U.S. Pat. No. 7,811,845, issued Oct. 12, 2010, the entire contents of which are incorporated herein by reference.

BACKGROUND

1. Technical Field

The present invention relates to methods for manufacturing light-emitting diodes and in particular to a method for producing high efficiency light-emitting diodes.

2. Description of the Related Art

Nitride semiconductor light emitting devices have been employed in a wide variety of applications, including traffic lights, backlights of electronic apparatus, outdoor optical displays, white light illumination apparatus, UV light apparatus, and data storage apparatus.

In a nitride semiconductor light-emitting device, a structure of the nitride semiconductor light-emitting device includes a substrate, which can be made of sapphire or SiC (silicon carbide). In a process of the nitride semiconductor light-emitting device manufacture, the process includes forming an epitaxial light emitting stack on a substrate wafer, and then cutting the wafer into dice. The wafer can be separated into dice by a number of ways, for example, the wafer can be mechanically scribed, such as with a diamond scribe, and then be separated along scribing lines. However, the hardness of the sapphire or the SiC is greater than traditional III-V materials (for example, Si or GaAs), and it is difficult and time-consuming to cut the wafer made of sapphire or SiC. Furthermore, the consumption of the diamond is so great that the manufacturing cost is raised.

Another separation method involves scribing the wafer by a high energy density laser beam ablating the bonds between atoms of the substrate. In laser ablation scribing, the scribing temperature has to be high enough to break the crystal bonds of the substrate and then results in the build-up of waste material along the scribing lines. Because the light emitting from the light-emitting device can be absorbed by the waste material, the light extraction efficiency is reduced.

In U.S. Pat. No. 5,631,190, a dry etching method of removing by-products generated from cutting the silicon carbide substrate by the laser light is disclosed. However, the dry etching method can damage the device and affect the product characteristics. Besides, the dry etching method causes the wafer breakage and reduces the product yield.

In U.S. Pat. No. 6,849,524, a wet etching method of using a KOH cleaning solution to remove by-products generated from cutting the sapphire substrate by the laser light is disclosed. The cleaning solution can remove slag from the cutting and debris from the breaking. This method applies a protective coating on the cutting side of the sapphire wafer, and then cleans the sapphire wafer with the cleaning solution. However, the method cannot remove the slag completely and efficiently.

Therefore, how to remove the by-products resulting from the laser beam cutting efficiently to enhance the light extraction of LEDs becomes an important issue in the industry.

SUMMARY

Accordingly, the present invention is to provide a method of forming a light-emitting device having higher light-emitting efficiency. As embodied and broadly described herein, the present invention provides a method of high efficiency light-emitting device comprising the steps of cutting a light-emitting wafer by a laser beam, cleaning the light-emitting wafer by an acid solution to remove by-products resulted from the laser beam cutting. The light-emitting wafer includes a wafer substrate and a light-emitting stack disposed on the wafer substrate. The light-emitting device is formed after the steps of cutting the light-emitting wafer by the laser beam and cleaning the light-emitting wafer by the acid solution.

In summary, the method of cleaning the by-products resulted from the laser beam cutting on the light-emitting wafer by the acid solution can avoid the light absorption by the by-products, and the brightness of the light-emitting device can be enhanced greatly. Furthermore, the acid solution can remove the by-products efficiently, and the cleaning time can be reduced. Moreover, the problem of wafer breakage in the conventional process can be solved, and the product yield can be enhanced.

BRIEF DESCRIPTION OF THE DRAWINGS

The accompanying drawings are included to provide easy understanding of the invention, and are incorporated herein and constitute a part of this specification. The drawings illustrate embodiments of the invention and, together with the description, serve to illustrate the principles of the invention.

DESCRIPTION OF THE PREFERRED EMBODIMENTS

Figure 1A:
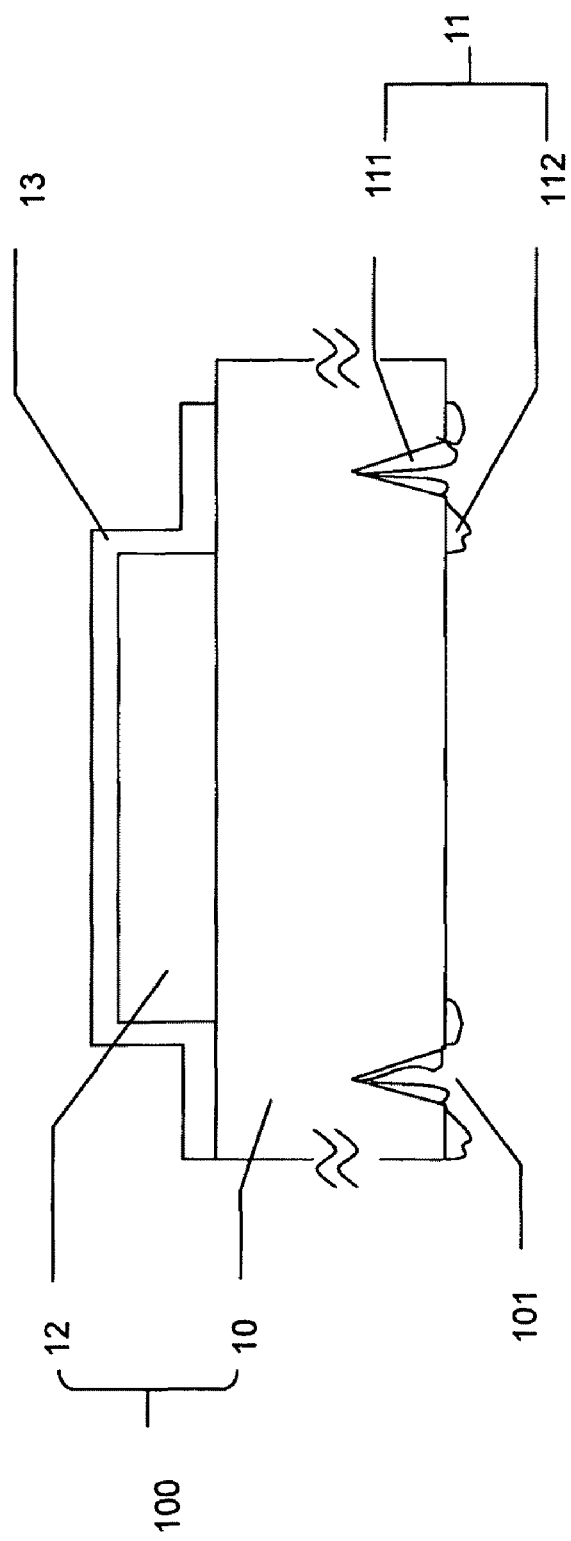
FIG. 1A is a schematic cross-sectional view of a light-emitting device with by-products deposited in accordance with a first embodiment of the present invention.

Reference will now be made in detail to the preferred embodiments of the present invention, examples of which are illustrated in the accompanying drawings. Wherever possible, the same reference numbers are used in the drawings and the description to refer to the same or like parts.

Figure 1B:
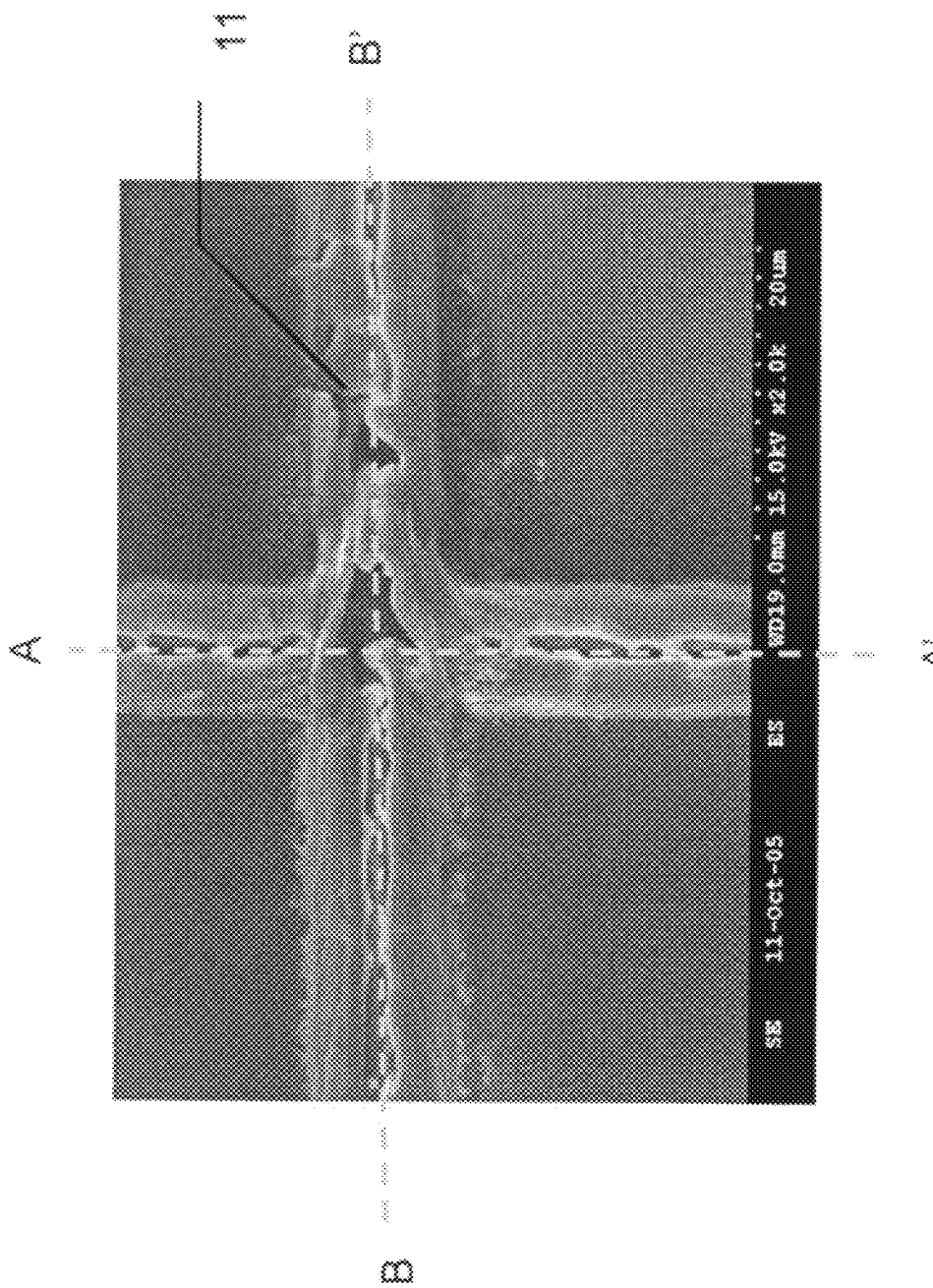
FIG. 1B is an SEM photograph showing a top-view of the light-emitting device with the by-products.
Figure 1C:
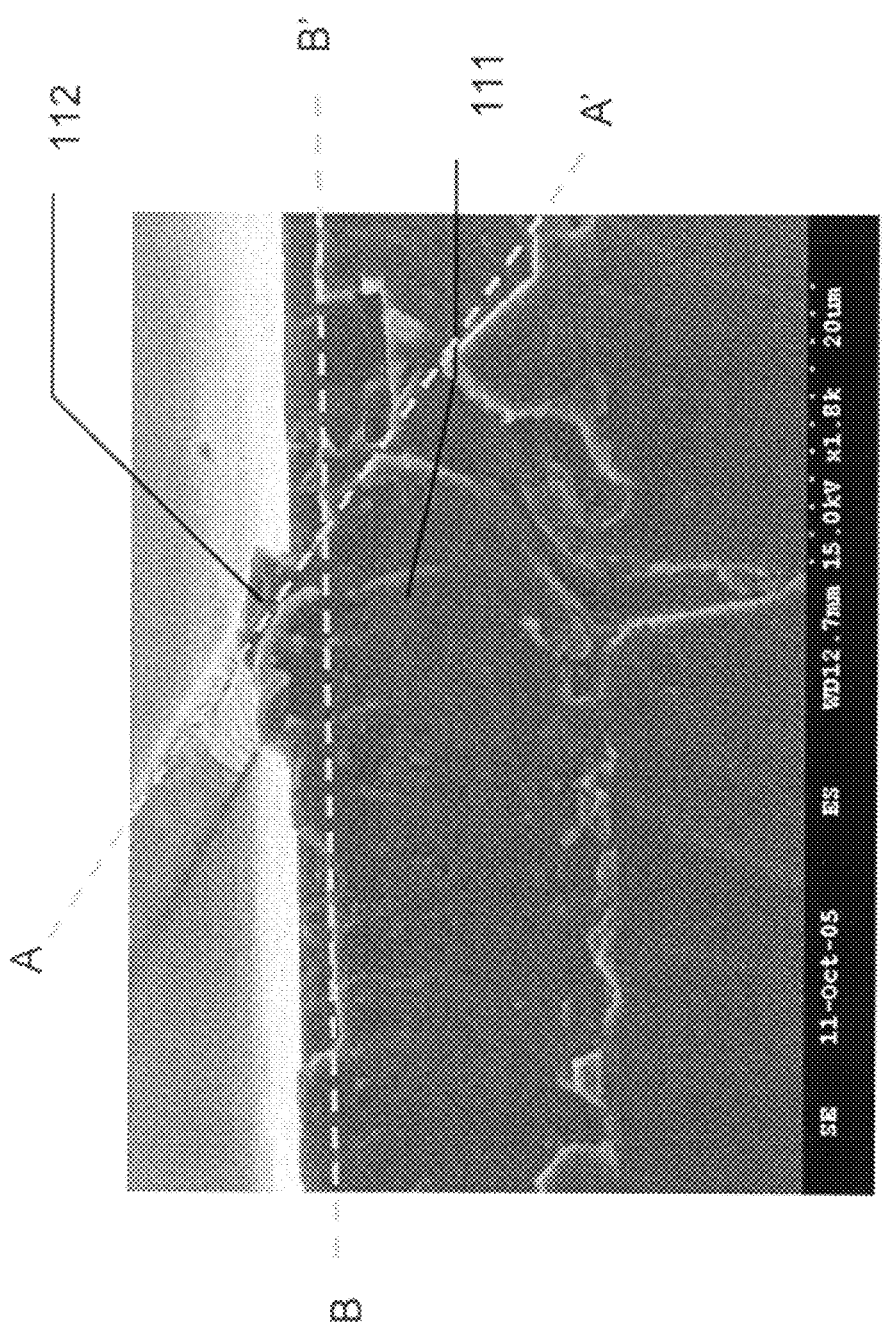
FIG. 1C is an SEM photograph showing a cross-sectional view of the light-emitting device with the by-products.

Referring to FIGS. 1A-1C, the schematic cross-sectional views showing a light-emitting device with by-products deposited in accordance with a first embodiment of the present invention respectively. The processes of manufacturing the light-emitting device comprises disposing a light-emitting stack 12 over an upper surface of a substrate 10 to form a light-emitting unit 100, coating a first protective layer 13 on an upper surface of the light-emitting stack 12. In another embodiment, the light-emitting stack 12 is trapezoid wherein the upper surface is smaller than the lower surface so the first protective layer 13 is easier to be coated on the light-emitting stack 12. The lower surface of the substrate 10 is cutting by a laser beam of a wavelength less than 365 nm to generate cutting lines 101, and then putting the light-emitting unit 100 with the first protective layer 13 into a warm acid solution for a predetermined period of time. By-products 11 comprise a first by-product 111 and a second by-product 112. The first by-product 111 are deposited in the cutting lines 101 and the second by-product 112 are deposited around the cutting lines 101 of the lower surface of the substrate 10 wherein the first and the second by-product 112 contain the debris of laser ablation from the light-emitting stack 12 and the substrate 10 such as sapphire.

FIG. 1B is an SEM (scanning electron microscope) photograph showing a top-view of the light-emitting device with by-products. One of the cutting lines 101 has an extension direction A-A' and the other has an extension direction B-B'. There are a lot of by-products 11 deposited around the cutting lines 101. FIG. 1C is an SEM photograph showing a cross-sectional view of the light-emitting device with by-products taken by. There are a lot of by-products 11 deposited around the cutting line along with direction A-A' and in the cutting line along with direction B-B'.

The compositions of the acid solution are phosphoric acid ($H_3PO_4$) and sulfuric acid ($H_2SO_4$). The preferred cleaning temperature of the acid solution is higher than the atmospheric temperature. In a preferred embodiment, the temperature of the acid solution is 175~300° C. Furthermore, a second protective layer can be deposited on the lower surface of the substrate 10 in order to avoid any damage caused by the acid solution.

Figure 2A:
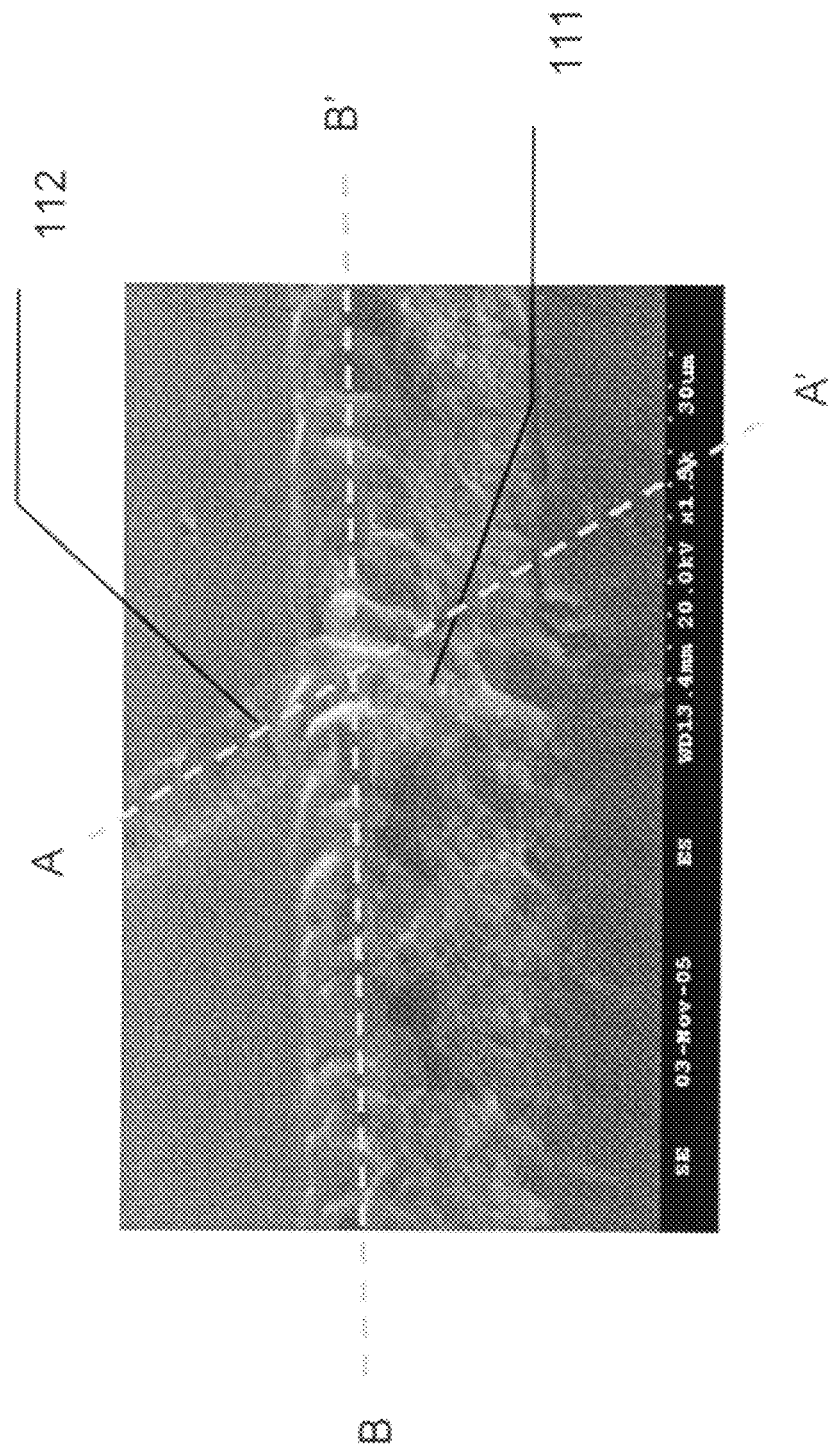
FIGS. 2A, 2B, and 2C are SEM photographs of the light-emitting device with the by-products.
Figure 2B:
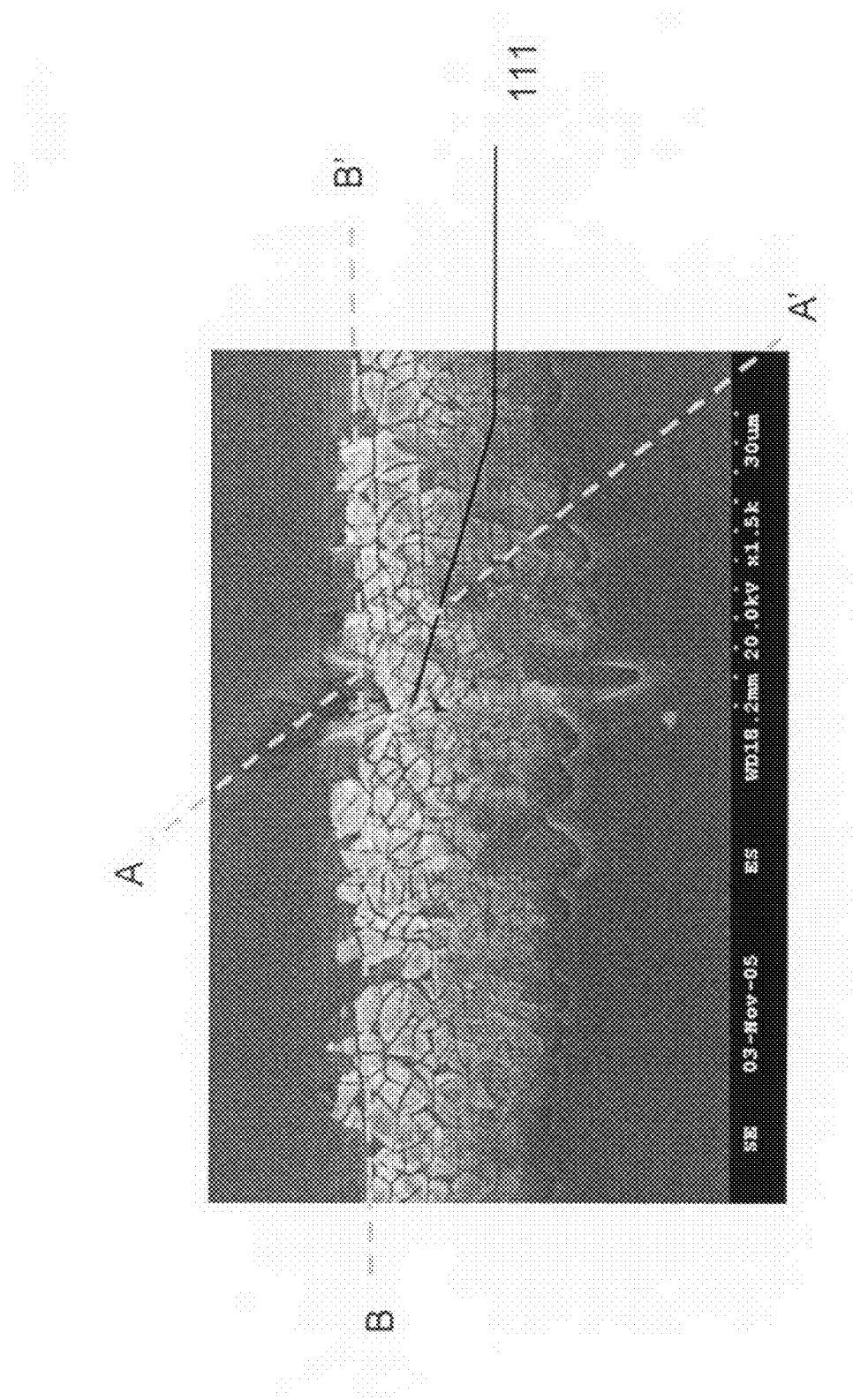
Figure 2C:
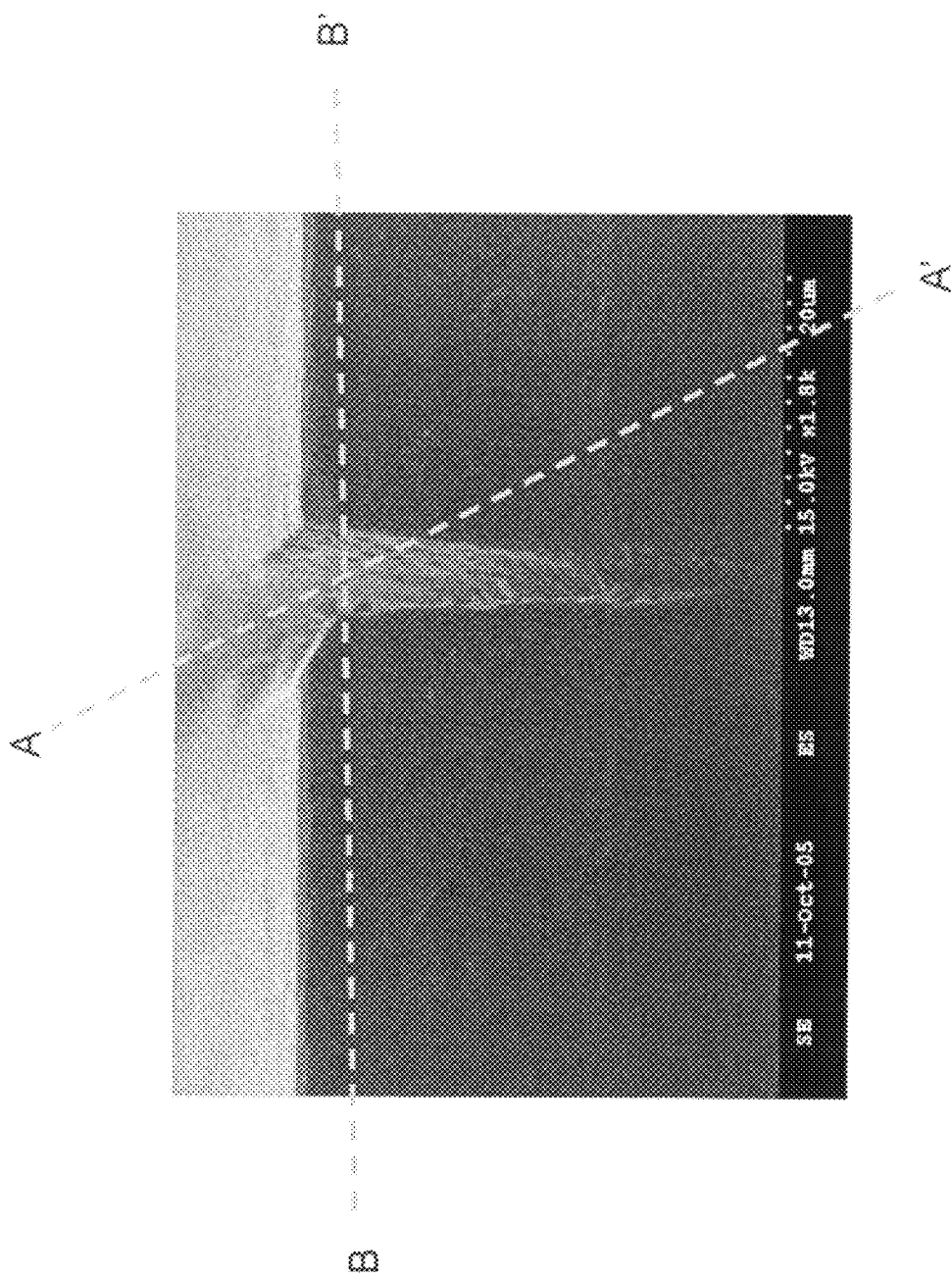

FIGS. 2A to 2C are SEM photographs showing the results of several experiments with different cleaning temperature and cleaning time. Referring to FIG. 2A, the cutting lines are cleaned by an acid solution in an experiment I. The ratio of the $H_3PO_4$ to the $H_2SO_4$ adopted in experiment I is 2:1, and the temperature of the acid solution is 130° C. The light-emitting device 1 is cleaned in the acid solution for 10 minutes, but the first and second by-products 111 and 112 cannot be removed. Referring to FIG. 2B, the cutting lines are cleaned by an acid solution in an experiment II. The light-emitting device 1 is cleaned in the acid solution having the temperature of 240° C. for 2 minutes. The second by-product 112 deposited around the cutting line of the lower surface of the substrate 10 are removed, but the first by-product 111 deposited in the cutting line still cannot be removed. Referring to FIG. 2C, the cutting lines are cleaned by an acid solution in an experiment III. The light-emitting device 1 is cleaned in the acid solution of the temperature of 330° C. for 1 minute, and the first and second by-products 111 and 112 are totally removed.

Figure 3:
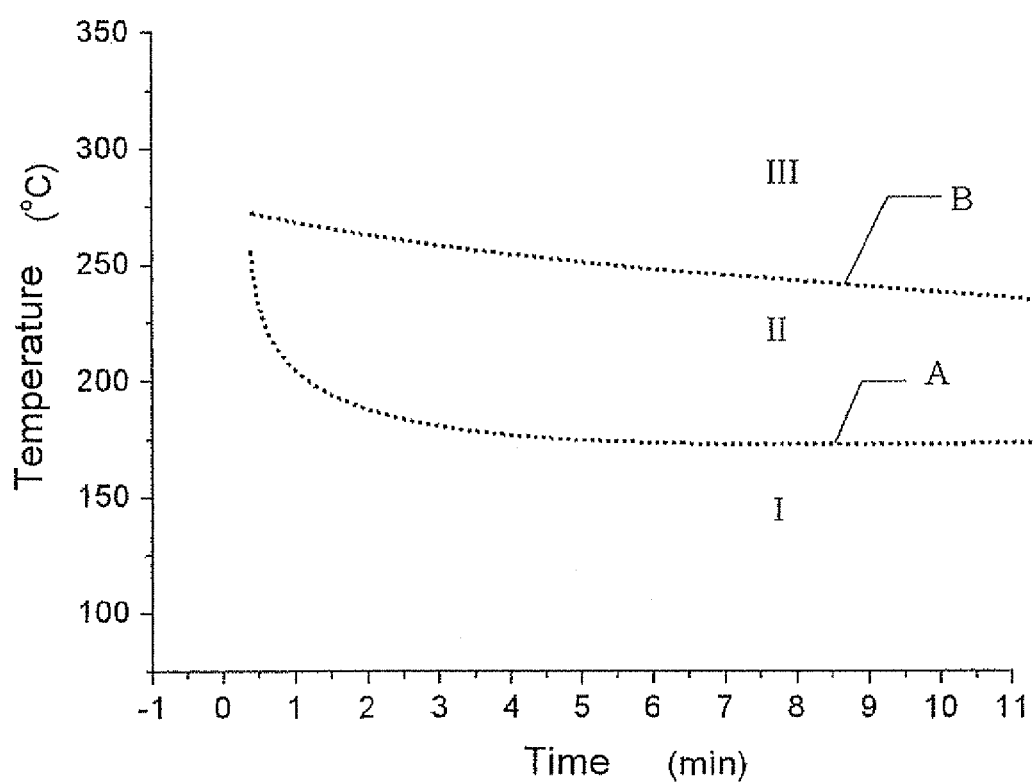
FIG. 3 is a diagram showing a relationship between by-products cleaning efficiency, cleaning temperature, and cleaning time.

The foregoing are just some experiments of the first embodiment. After many experiments, the results are plotted in FIG. 3. The curve A is a limit of the cleaning condition to remove the second by-product 112, and the curve B is a limit of the cleaning condition to remove the first by-product 111 and the second by-product 112. If a cleaning procedure is performed with the condition of region I, the by-products cannot be removed. When a cleaning procedure is performed with the condition of region II for which the temperature of the acid solution is between 175° C. to 275° C., the second by-product 112 can be removed. When a cleaning procedure is performed with the condition of region III for which the temperature of the acid solution is equal or greater than 275° C., the first by-product 111 and the second by-product 112 can be removed.

The composition ratio of the acid solution can be changed based on the user requirement. If the user prefers a shorter cleaning time, an acid solution with a higher ratio of the $H_2SO_4$ and higher cleaning temperature can serve the purpose. The acid solution has a good selectivity between the by-products 11 and the substrate 10, and most of the by-products 11 can be removed without damaging the substrate.

Figure 4A:
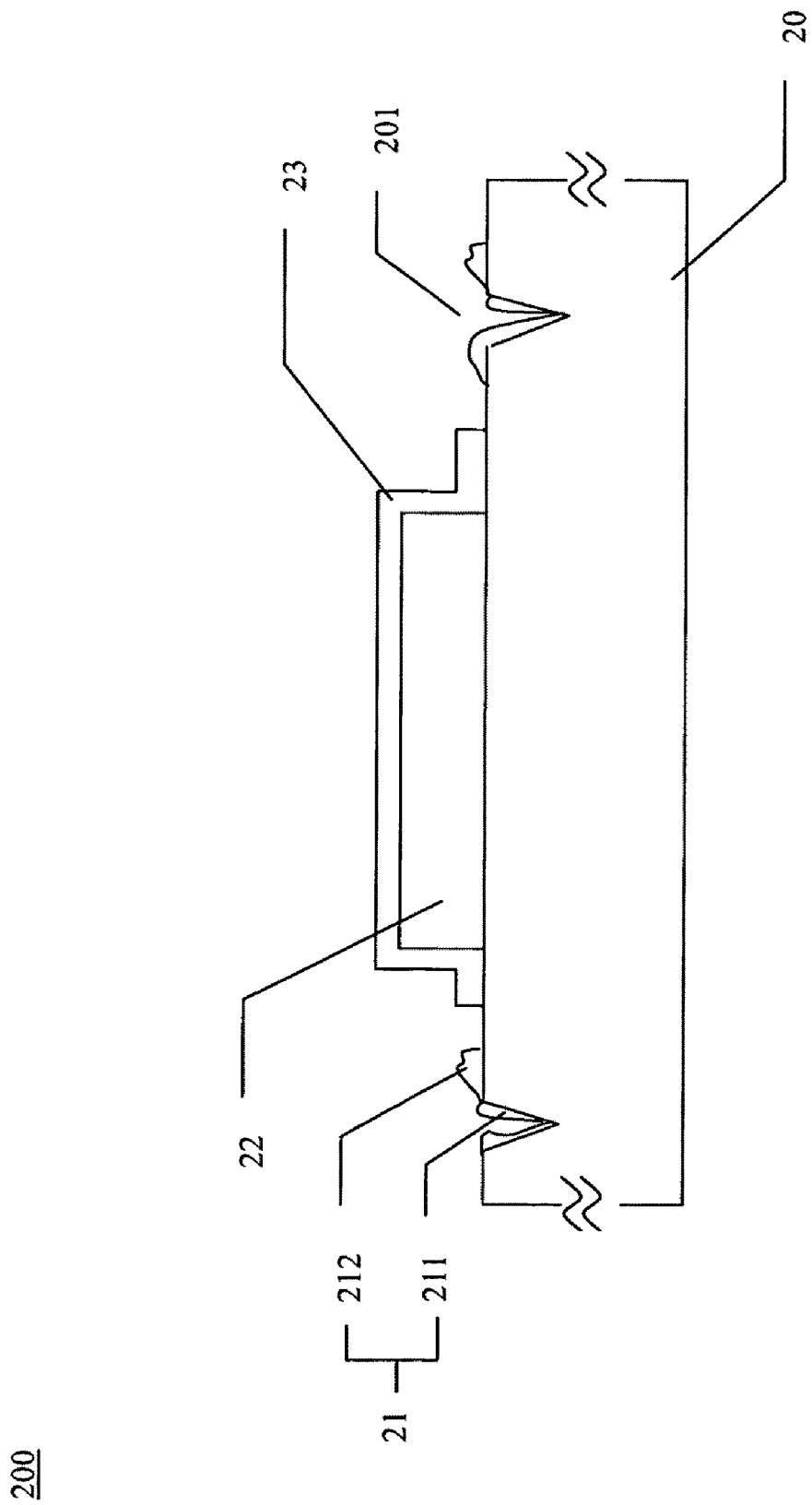
FIGS. 4A and 4B are schematic cross-sectional views of a light-emitting device with by-products deposited in accordance with a second embodiment of the present invention.
Figure 4B:
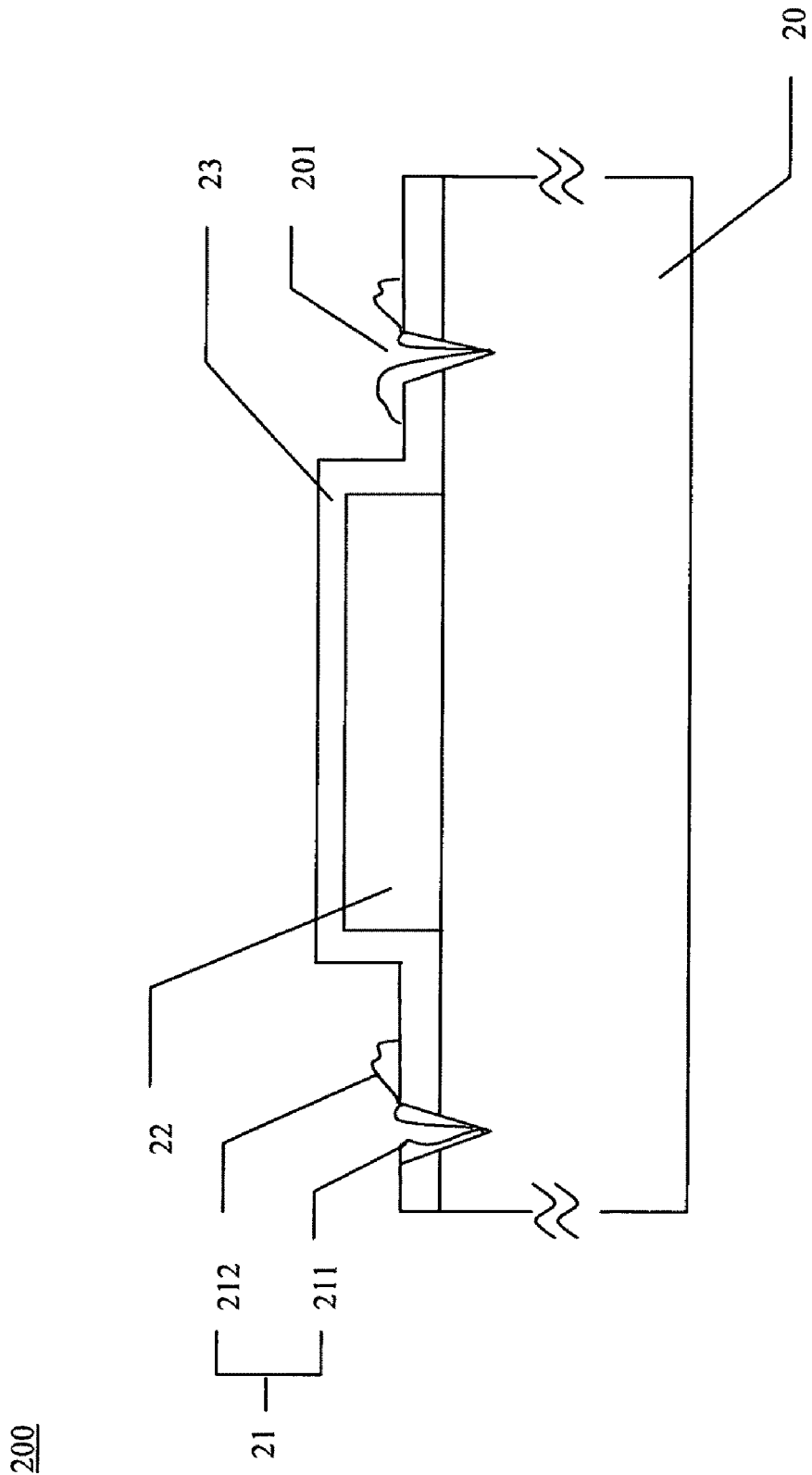

Referring to FIGS. 4A and 4B, schematic cross-sectional views of a light-emitting device with by-products in accordance with a second embodiment of the present invention is shown. The method of manufacturing the light-emitting device comprises disposing a light-emitting stack 22 over an upper surface of a substrate 20 to form a light-emitting unit 200, coating a first protective layer 23 of an exemplary thickness of 1-4 μm on an upper surface of the light-emitting stack 22. Referring to FIG. 4B, in some embodiments, the first protective layer 23 is also covering the substrate 20. In another embodiment, the light-emitting stack 22 is trapezoid wherein the upper surface is smaller than the lower surface so the first protective layer 23 is easier to be coated on the light-emitting stack 22.

Next, cutting the light-emitting stack 22 from the upper surface by a laser beam with a wavelength less than 365 nm, and putting the light-emitting unit 200 with the first protective layer 23 into an acid solution for a predetermined period of time to remove the by-products resulted from the laser cutting. When the substrate is cut by the laser beam from the upper surface of the substrate 20, cutting lines 201 are formed. By-products 21 comprise a third by-product 211 and a forth by-product 212. The third by-product 211 are deposited in the cutting lines 201 and the forth by-product 212 are deposited around the cutting lines 201 wherein the third and the fourth by-products contain the debris of laser ablation from the light-emitting stack 22 and the substrate 20.

The composition of the acid solution includes $H_3PO_4$ and $H_2SO_4$. The preferred temperature of the acid solution is higher than the atmospheric temperature. In a preferred embodiment, the temperature of the acid solution is 175~300° C. In the second embodiment, the temperature of the acid solution is 320° C. The light-emitting device 2 is cleaned in the acid solution for 10-60 seconds. A second protective layer can be deposited on the lower surface of the substrate 20 in order to avoid any damage caused by the acid solution. The depth of the cutting lines 201 can reach to the lower surface of the substrate 20.

Figure 5A:
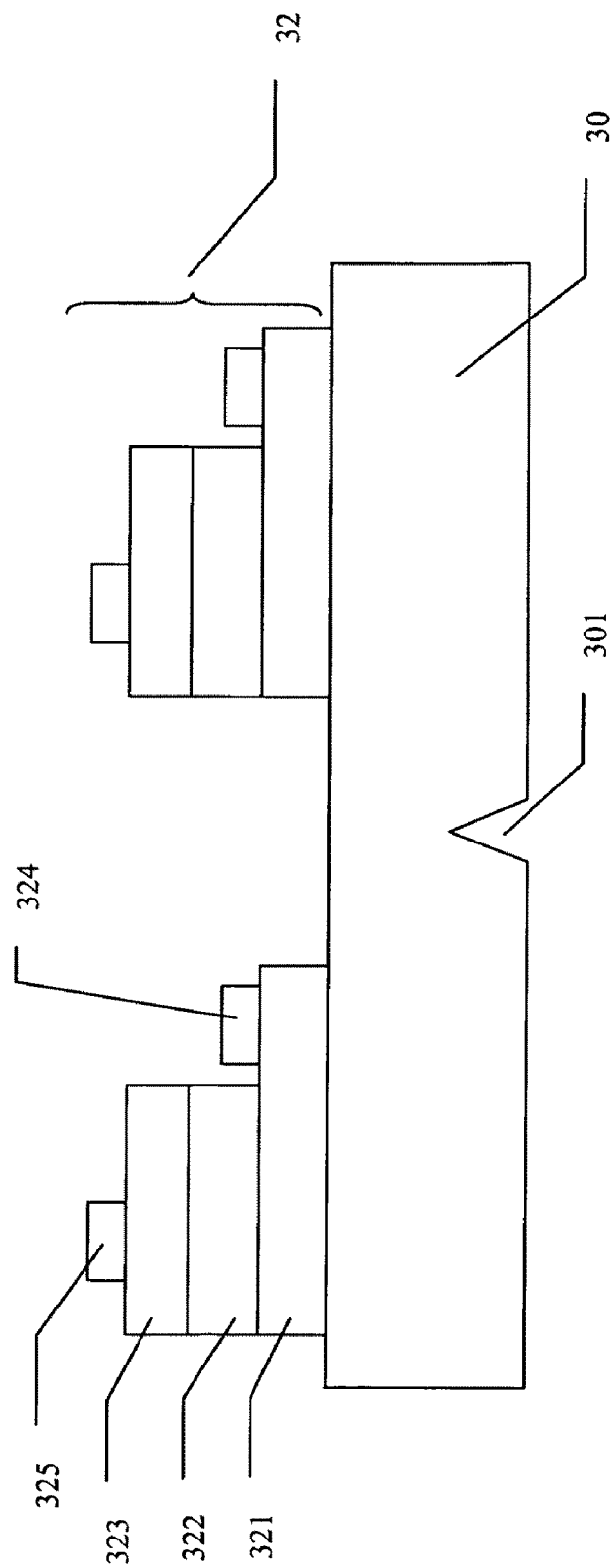
FIGS. 5A and 5B are schematic cross-sectional views of light emitting device followed by chip processing in accordance with the first and second embodiments of the present invention.
Figure 5B:
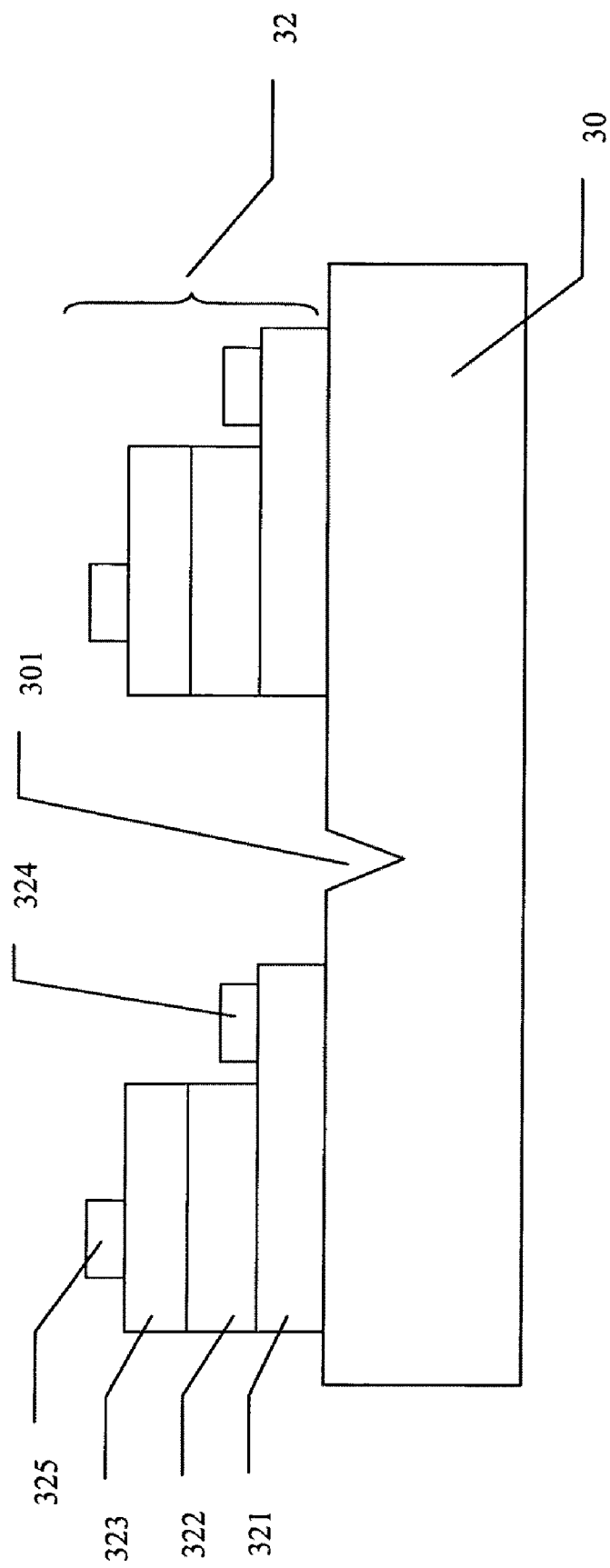

Referring to FIGS. 5A and 5B, after removing the by-products, the protective layers are removed. The light emitting stack 32 includes a first semiconductor layer 321, a semiconductor light-emitting layer 322, and a second semiconductor layer 323. The semiconductor light-emitting layer 322 and the second semiconductor layer 323 are etched to expose partial of the first semiconductor layer 321. Following, a first electrode 324 and a second electrode 325 are formed on the first semiconductor layer 321 and the second semiconductor layer 323 respectively.

In one embodiment of the present invention, the method thereof further comprises a wafer grinding, wafer polishing and wafer breaking process to separate the light-emitting device into chips.

The material of the substrate comprises at least one material selected from the group consisting of sapphire, SiC, GaN, AlN, ZnO, MgO, and any combination thereof. The material of the light-emitting stack comprises at least one material selected from the group consisting of Ga, Al, In, As, P, N, Si, and any combination thereof. The material of the first protective layer or the second protective layer comprises at least one material selected from the group consisting of gold, platinum, titanium, $Ta_2O_4$, $TiO_2$, $Al_2O_3$, Si, carbon film, $Si_3N_4$, $SiO_2$, epoxy, and photoresist.

In this invention, the light-emitting stack is cutting before the wafer polishing process; it can reduce the breaking rate of the wafer, especially when the thickness of the light-emitting stack is increasing. Besides, by cutting the light-emitting stack before forming the electrodes and dicing process, the light emitting stack is well protected to avoid the acid solution damaging the semiconductor layer and its electrical property.

It will be apparent; however, that other variations and modifications may be made to the described embodiments, with the attainment of some or all of their advantages. Therefore, it is the object of the appended claims to cover all such variations and modifications that fall within the spirit and scope of the invention.

What is claimed is:

1. A method for manufacturing a light-emitting device comprising the steps of:
    cutting a light-emitting unit by a laser beam thereby forming a cutting line in the light-emitting unit;
    generating a first by-product and a second by-product by the cutting, wherein the first by-product is capable of being removed at a first temperature or above, the second by-product is capable of being removed at a second temperature or above, and the first temperature is higher than the second temperature;
    removing the first by-product and the second by-product by a chemical solution at a temperature higher than the first temperature.

2. The method for manufacturing a light-emitting device according to claim 1, wherein the light-emitting unit comprises a substrate and a light-emitting stack disposing on an upper surface of the substrate.

3. The method for manufacturing a light-emitting device according to claim 2, wherein the light-emitting stack further comprises:
    a first semiconductor layer;
    a semiconductor light-emitting layer disposed over the first semiconductor layer; and
    a second semiconductor layer disposed over the semiconductor light-emitting layer, wherein a portion of the second semiconductor layer and the semiconductor light-emitting layer are removed to expose a portion of the first semiconductor layer;
    a first electrode on the exposed first semiconductor layer; and
    a second electrode on the second semiconductor layer.

4. The method for manufacturing a light-emitting device according to claim 1, wherein the first by-product is deposited in the cutting line and the second by-product is deposited around the cutting line.

5. The method for manufacturing a light-emitting device according to claim 1, wherein a composition of the chemical solution includes phosphoric acid ($H_3PO_4$) and sulfuric acid ($H_2SO_4$).

6. The method for manufacturing a light-emitting device according to claim 5, wherein the composition ratio of the $H_3PO_4$ to the $H_2SO_4$ is 2:1.

7. The method for manufacturing a light-emitting device according to claim 1, wherein the second temperature is around 175° C.

8. The method for manufacturing a light-emitting device according to claim 1, wherein the first temperature is around 275° C.

9. The method for manufacturing a light-emitting device according to claim 2, further comprising a first protective layer disposed over an upper surface of the light-emitting stack, wherein a portion of the first protective layer are directly covering the substrate.

10. The method for manufacturing a light-emitting device according to claim 2, wherein a second protective layer is disposed over a lower surface of the substrate.

11. The method for manufacturing the light-emitting device according to claim 2, wherein the step of cutting a light-emitting unit comprises cutting a lower surface of the substrate by the laser beam thereby forming the cutting line therein.

12. The method for manufacturing a light-emitting device according to claim 9, wherein the step of cutting a light-emitting unit comprises cutting the first protective layer covering the substrate by the laser beam, and forming the cutting line in the substrate.

13. The method for manufacturing a light-emitting device according to claim 12, wherein a depth of the cutting line reaches a lower surface of the substrate.

14. The method for manufacturing a light-emitting device according to claim 9, wherein the first protective layer comprises at least one material selected from the group consisting of gold, platinum, titanium, $Ta_2O_4$, $TiO_2$, $Al_2O_3$, Si, carbon film, $Si_3N_4$, $SiO_2$, epoxy, and photoresist.

15. The method for manufacturing the light-emitting device according to claim 10, wherein the second protective layer comprises at least one material selected from the group consisting of gold, platinum, titanium, $Ta_2O_4$, $TiO_2$, $Al_2O_3$, Si, carbon film, $Si_3N_4$, $SiO_2$, epoxy, and photoresist.

16. The method for manufacturing a light-emitting device according to claim 2, wherein the substrate comprises at least one material selected from the group consisting of sapphire, SiC, GaN, AlN, ZnO, MgO, and any combination thereof.

17. The method for manufacturing a light-emitting device according to claim 2, wherein the light-emitting stack comprises at least one element selected from the group consisting of Ga, Al, In, As, P, N, Si, and any combination thereof.

18. The method for manufacturing a light-emitting device according to claim 2, wherein the light-emitting stack is trapezoid with the upper surface smaller than the lower surface thereof.

* * * * *